US009836565B2

(12) United States Patent
Kang

(10) Patent No.: US 9,836,565 B2
(45) Date of Patent: Dec. 5, 2017

(54) ELECTRONIC DESIGN AUTOMATION METHOD AND APPARATUS THEREOF

(71) Applicant: SAMSUNG ELECTRONICS CO., LTD., Suwon-si, Gyeonggi-do (KR)

(72) Inventor: Dae-Kwon Kang, Yongin-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 85 days.

(21) Appl. No.: 14/824,529

(22) Filed: Aug. 12, 2015

(65) Prior Publication Data

US 2016/0188773 A1 Jun. 30, 2016

(30) Foreign Application Priority Data

Dec. 24, 2014 (KR) ........................ 10-2014-0188645

(51) Int. Cl.
*G06F 17/50* (2006.01)
(52) U.S. Cl.
CPC ........ *G06F 17/5022* (2013.01); *G06F 17/505* (2013.01)
(58) Field of Classification Search
CPC .......................... G06F 17/5022; G06F 17/505
USPC ............... 716/103, 104, 106, 136; 703/2, 14
See application file for complete search history.

(56) References Cited

U.S. PATENT DOCUMENTS

| 4,947,314 A * | 8/1990 | Sumida | B25J 9/1661 |
| | | | 700/12 |
| 5,129,046 A * | 7/1992 | Tanabe | G06F 8/74 |
| | | | 345/441 |
| 5,706,494 A * | 1/1998 | Cochrane | G06F 17/30595 |
| 6,117,180 A * | 9/2000 | Dave | G06F 9/4887 |
| | | | 703/2 |
| 7,082,584 B2 * | 7/2006 | Lahner | G06F 17/5022 |
| | | | 716/102 |
| 7,745,144 B2 | 6/2010 | Roberts et al. | |
| 7,752,584 B2 | 7/2010 | Yang | |
| 7,886,282 B1 * | 2/2011 | Satish | G06F 8/75 |
| | | | 717/132 |
| 9,229,978 B2 * | 1/2016 | Weyerhaeuser | G06F 17/30991 |
| 9,424,112 B1 * | 8/2016 | Malamut | G06F 9/547 |

(Continued)

FOREIGN PATENT DOCUMENTS

| JP | 03002977 A | * | 1/1991 |
| JP | 04111169 A | * | 4/1992 |

(Continued)

OTHER PUBLICATIONS

Aihara (Machine English Translation of Japanese Patent Document No. 03-002977, translated by JPO website on Jan. 8, 2017, 6 pages).*

*Primary Examiner* — Phallaka Kik
(74) *Attorney, Agent, or Firm* — F. Chau & Associates, LLC

(57) ABSTRACT

Provided are an electronic design automation apparatus and method. The electronic design automation method includes: loading, by a processor, a rule file having limitations on a reference design file; extracting, by the processor, a plurality of unit operations for respectively performing the limitations from the loaded file; and automatically forming, by the processor, a flowchart corresponding to the rule file based on relations between the plurality of unit operations.

18 Claims, 18 Drawing Sheets

(56) References Cited

U.S. PATENT DOCUMENTS

| | | | | |
|---|---|---|---|---|
| 2006/0090144 A1* | 4/2006 | Lakshmanan | ....... | G06F 17/5081 |
| | | | | 716/112 |
| 2006/0271907 A1* | 11/2006 | Izuha | .................. | G06F 17/5031 |
| | | | | 716/52 |
| 2010/0287540 A1* | 11/2010 | Takai | .................. | G06F 9/45512 |
| | | | | 717/137 |
| 2014/0359559 A1* | 12/2014 | Qi | ............................. | G06F 8/35 |
| | | | | 717/105 |
| 2016/0261466 A1* | 9/2016 | Daniel | ..................... | G06F 8/10 |

FOREIGN PATENT DOCUMENTS

| | | |
|---|---|---|
| JP | 06-290235 | 10/1994 |
| JP | 10-063699 | 3/1998 |
| JP | 11-174659 | 7/1999 |
| JP | 2002-230070 | 8/2002 |
| JP | 2005-031591 | 2/2005 |
| JP | 2006-350420 | 12/2006 |
| JP | 2009-020725 | 1/2009 |
| KR | 1020100127425 | 12/2010 |
| WO | WO 2007090839 A1 * | 8/2007 ............ H04W 16/04 |

* cited by examiner

FIG. 5

Input : A (Active)
B (Gate)
C (Contact)

Operation : OPR1 = A and B
OPR2 = B and $\overline{C}$
OPR3 = OPR1 and OPR2

Output : CON = OPR3

(a) CON : Output = (A OR B) OR ((A OR B) AND D)
Input : A, B, D (b) FLC :

(c) Report : Input Fail

ELECTRONIC DESIGN AUTOMATION METHOD AND APPARATUS THEREOF

CROSS-REFERENCE TO RELATED APPLICATION

This application claims priority under 35 U.S.C. §119 to Korean Patent Application No. 10-2014-0188645, filed on Dec. 24, 2014, in the Korean Intellectual Property Office, the disclosure of which is incorporated by reference in its entirety herein.

BACKGROUND

1. Technical Field

The inventive concept relates to an electronic design automation apparatus that may be easily used or accurately produce designs, and an electronic design automation method.

2. Discussion of Related Art

An integrated circuit is a set of electronic circuits on one small plate ("chip") of semiconductor material. Integrated circuits can be highly integrated or have a very small size. Accordingly, it can be difficult to design an integrated circuit. Electronic Design Automation (EDA) is a category of software tools for designing electronic system such as printed circuit boards and integrated circuit. Design Rule Checking is the area of EDA that determines whether the physical layout of a particular chip satisfies a series of recommended parameters called Design Rules, which may stored in a rule file. Optical rule checking is used to predict the failure of wafer shapes due to process proximity effects. When the size of the integrated circuits are very small (e.g., 20 nm or below), the rule file coded in an EDA tool language used for a design rule check (DRC) or an optical rule check (ORC) may have thousands of lines. Accordingly, code errors may easily occur, and thus, it is highly likely that a product manufactured using the rule file is defective due to the code errors.

SUMMARY

At least one embodiment of the inventive concept provides an electronic design automation apparatus that is easy to use or capable of accurately designing an integrated circuit, and an electronic design automation method.

According to an example embodiment of the inventive concept, there is provided an electronic design automation method including: loading, by a processor, a rule file having limitations on a reference design file; extracting, by the processor, a plurality of unit operations for respectively performing the limitations from the loaded file; and automatically forming, by the processor, a flowchart corresponding to the rule file based on relations between the plurality of unit operations.

According to an example embodiment of the inventive concept, there is provided an electronic design automation apparatus including: a first processor configured to detect and correct errors of a rule file by analyzing the rule file having limitations on a reference design file; and a second processor configured to generate a final design file with regard to an integrated circuit, based on the rule file processed by the rule file processing unit. The first processor is configured to analyze the rule file and detect and correct the errors of the rule file by forming a flowchart corresponding to the rule file.

According to an exemplar embodiment of the inventive concept, there is provided an electronic design automation method including: automatically forming a flowchart corresponding to a rule file having limitations on a reference design file; debugging errors of the rule file by analyzing the flowchart to generate a corrected rule file; and generating a final design file regarding an integrated circuit based on the corrected rule file.

According to an example embodiment of the inventive concept, there is provided a non-transitory computer-readable storage medium used by a computer to implement a method of performing electronic design automation and storing commands executable by the computer, the method including: extracting each layer from a rule file written in an arbitrary language and used for at least one rule check; forming a dot graph based on the layers extracted from the rule file; and forming a flowchart corresponding to the rule file, based on the dot graph.

According to an example embodiment of the inventive concept, there is provided a method of forming an integrated circuit, the method including: automatically forming a flowchart corresponding to a rule file having limitations on a reference design file; debugging errors of the rule file by analyzing the flowchart to generate a corrected rule file; generating a final design file representing the integrated circuit based on the corrected rule file; and manufacturing the integrated circuit by using the final design file.

According to an example embodiment of the inventive concept, there is provided a method of detecting an error in a rule file associated with an integrated circuit. The method includes: generating a flow chart from rule checks in the rule file; determining first inputs from the flow chart; and comparing the first inputs with second inputs in a limitation of a reference design file representing the integrated circuit to determine whether the rule file has an error.

BRIEF DESCRIPTION OF THE DRAWINGS

Example embodiments of the inventive concept will be more clearly understood from the following detailed description taken in conjunction with the accompanying drawings in which:

FIGS. 4 and 5 illustrate an example in which layers are extracted from a rule file, according to an example embodiment of the inventive concept;

DETAILED DESCRIPTION

Figure 1:
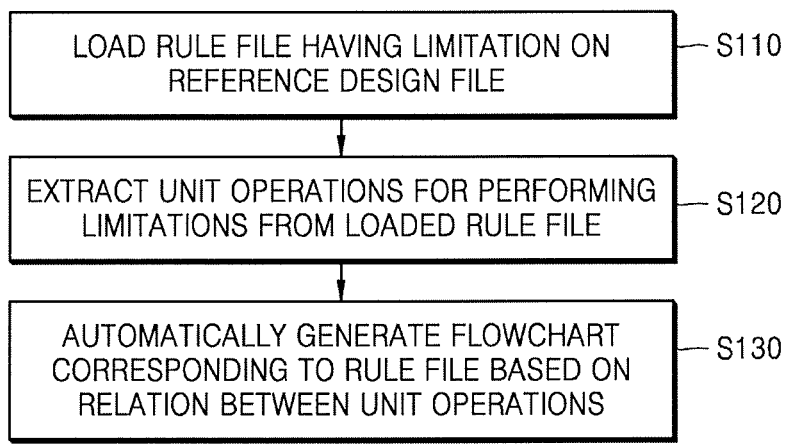
FIG. 1 is a flowchart of an electronic design automation method according to an example embodiment of the inventive concept.

Hereinafter, an electronic design automation apparatus and method will now be described more fully with reference to the accompanying drawings, in which example embodiments of the inventive concept are shown. An expression used in the singular encompasses the expression in the plural, unless it has a clearly different meaning in the context. Unless otherwise defined, like reference numerals in the drawings denote like elements.

FIG. 1 is a flowchart of an electronic design automation method according to an example embodiment of the inventive concept. Referring to FIG. 1, the electronic design automation method includes: loading a rule file having limitations on a reference design file (operation S110); extracting, from the loaded rule file, a plurality of unit operations for respectively performing the limitations (operation S120); and automatically forming a flowchart corresponding to the rule file based on relations between the unit operations (operation S130).

A present electronic device includes various integrated circuits. The integrated circuits perform multiple functions, but it is difficult to design the integrated circuits because of miniaturization and high integration. Electronic design automation technology has been developed to make design of integrated circuits easier. A tool for executing the electronic design automation hierarchically defines components forming the integrated circuits and designs the integrated circuits through iterative operations with regard to the components. The components may be, for example, active areas, contacts, etc. The reference design file is a file representing a design for an integrated circuit designed by using an electronic design automation tool in accordance with a user (e.g., a designer) request. The user request is specified in a specification. The reference design file may be created by using, for example, a graphic data system (GDS), a caltech intermediate format (CIF), or the like. The GDS, the CIF, or the like are created as a database including various components included in the integrated circuits.

The rule file is written in an arbitrary program language. For example, the rule file may be written in a language such as a standard verification rule format (SVRF) language, and a Tcl Verification Format (TVF) language. The rule file may be generated to change a design regarding a reference design file for an arbitrary purpose or to check a design. For example, the rule file may be generated to perform a design rule check (DRC) or an optical rule check (ORC). A change or check of the reference design file may be referred to as a limitation. The limitation for the DRC or the ORC may indicate, for example, an active area where a value of a distance between active areas is less than or equal to a predetermined value.

The limitation may include one or more rule checks. A limitation may be a width rule, a spacing rule, an enclosure rule, etc. The width rule specifies that minimum width of an object in the design. The spacing rule specifies the minimum distance between two adjacent objects in the design. The enclosure rule may specify that an object of one type, such as a contact, needs to be covered, with some additional margin by another layer. If one or more design rules in the rule file are violated by the reference design file, a product manufactured from the reference design file may not operate properly. Each limitation may be specified by a specification input by a user. An apparatus for implementing the tool for executing electronic design automation may provide an interface to the user to receive each limitation. In operation S110, a processor of the apparatus for implementing the tool for executing electronic design automation loads the rule file to verify whether the rule file is written in a compatible language such as an SVRF language or a TVF language. The process may perform this verification by comparing the format of limitations in the rule file against known formats of limitations/rules from known languages, such as SVRF and TVF. In an example embodiment, the processor is part of a microprocessor. For example, the rule file may be loaded by performing a file opening function on the rule file by the tool for executing the electronic design automation.

In an example embodiment, the design rules are a series of parameters provided by semiconductor manufacturers that enable a designer to verify the correctness of mask set or a photomask. A photomask is a series of electronic data that define the geometry for photolithography steps of semiconductor fabrication. Examples of masks include a p-well, a n-well, active, poly, contact, etc. Examples of design rules include active to active spacing, well to well spacing, minimum channel length of a transistor, minimum metal width, etc.

Each rule check may include a plurality of unit operations. In operation S120, the processor of the apparatus for implementing the tool for executing electronic design automation extracts a plurality of unit operations from the rule file. In the above-described reference design file, when an area, where a value of a distance between active areas is less than or equal to a predetermined value, is checked, an operation of comparing the distance between the active areas with a predetermined value, an operation of setting at least one active area corresponding to a limitation (or a rule check) according to a comparison value, etc. may be included in the unit operation of the rule check. In the present example embodiment, the unit operations may be referred to as unit layers or unit operation layers. An example in which the unit operations are extracted from the rule file will be later described in detail.

In operation S130, the processor of the apparatus for implementing the tool for executing electronic design automation automatically forms a flowchart corresponding to the rule file based on relations between the extracted unit operations. For example, when an output of a unit operation 1 is calculated in a unit operation 2, the unit operation 1 and the unit operation 2 become processes of a flowchart, and the flowchart may have a flow line in which a process indicating the unit operation 1 and a process indicating the unit operation 2 are sequentially linked. An example in which the unit operations are extracted from the rule file will be later described in detail.

Figure 2:
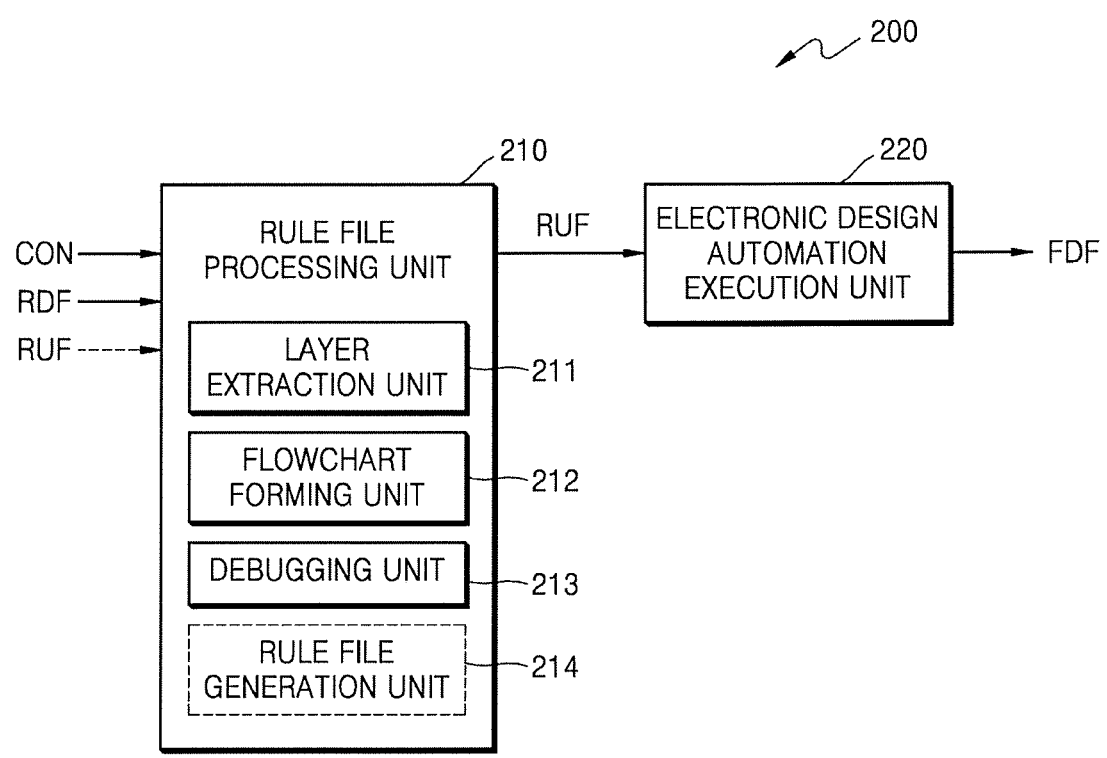
FIG. 2 is a block diagram of an electronic design automation apparatus according to an example embodiment of the inventive concept.

The electronic design automation method of FIG. 1 may be performed by an electronic design automation apparatus 200 of FIG. 2. Referring to FIG. 2, the electronic design automation apparatus 200 includes a rule file processing unit 210 and an electronic design automation execution unit 220. In an example embodiment, the rule file processing unit 210 and the electronic design automation execution unit 220 are both processors. The rule file processing unit 210 detects and correct errors of a rule file RUF by analyzing the rule file RUF having a limitation CON on a reference design file RDF. The reference design file RDF can be analyzed using at least one limitation CON in the rule RUF to determine whether objects in the reference design file RDF comply with the limitations. When one or more objects are found not to comply, a correction can be performed on the reference design file RDF to generate a corrected reference design file that complies with the limitations. In an example embodiment, the correction is an optical proximity correction (OPC). Hereinafter, for convenience of explanation, the same reference numerals are used to refer to the rule file RUF before and after the errors of the rule file RUF are detected and corrected. The electronic design automation execution unit 220 generates a final design file FDF representing an integrated circuit, based on the rule file RUF processed by the rule file processing unit 210, that is, the rule file RUF of which the errors are corrected after the rule file RUF is analyzed.

The rule file processing unit 210 includes a layer extraction unit 211 and a flowchart forming unit 212. In an example embodiment, the layer extraction unit 211 and the flowchart forming unit 212 are each processors. The rule file processing unit 210 detects and corrects the errors of the rule file RUF by receiving the processed rule file RUF from the outside, or detects and corrects errors after the rule file RUF is generated based on a reference design file RDF and a limitation CON. In the latter case, the rule file processing unit 210 further includes a rule file generation unit 214 for generating the rule file RUF.

Figure 3:
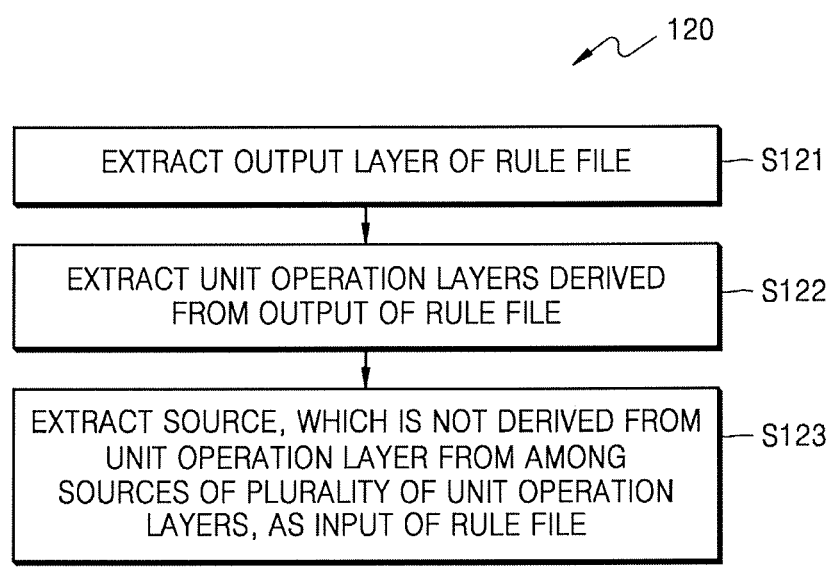
FIG. 3 is a flowchart of an operation performed by a rule file processing unit of FIG. 2.

The layer extraction unit 211 extracts layers from the rule file RUF. The layer extraction unit 211 may extract each layer of the rule file RUF according to a method of FIG. 3. Referring to FIGS. 2 and 3, the layer extraction unit 211 extracts an output layer of the rule file RUF, in operation S121. The output layer of the rule file RUF may be extracted by searching for program code indicating an output from among program codes included in the rule file RUF. For example, when the rule file RUF is written in a language such as an SVRF language or a TVF language, a layer designated by program code indicating a rule check may be output as an output layer. The output layer may indicate a limitation CON. In the reference design file RDF, when the rule file RUF is generated to check an active area where the value of the distance between the active areas is less than or equal to the predetermined value, the output layer may include the active area where the value of the distance between the active areas is less than or equal to the predetermined value.

The unit operations (unit operation layers) derived from the output layer of the rule file RUF are sequentially extracted in operation S122. For example, operation 1 of comparing the distance between the active areas with a predetermined value and operation 2 of setting at least one active area corresponding to a limitation (or a rule check) according to a comparing result may be included in the unit operation layers in order to check the active area where the value of the distance between the active areas is less than or equal to the predetermined value. In this case, the output layer may indicate the active area where the value of the distance between the active areas is less than or equal to the predetermined value. In the rule file RUF, operation 2 is derived from operation 1, and the output layer is derived from operation 2. Deriving operation 2 from operation 1 means that operation 1 is an input or source of operation 2, and deriving the output layer from operation 2 means that operation 2 is an input or source of the output layer. In the above-described example, the output layer, operation 2, and operation 1 are sequentially extracted.

The layer extraction unit 211 may extract a source, which is not derived from an operation layer from among sources of the unit operation layers, as an input (an input layer) of the rule file RUF, in operation S123. The input layer may include a plurality of objects or sources in accordance with limitations or rule checks. A layer may be a collection of shapes, edges, or edge pairs. In the above-described example, the input layer may include an active layer (an active area) on the reference design file RDF. The input layer is derived from the aforementioned operation 1. Sources included in the input layer are not derived from other unit operation layers.

Figure 4:
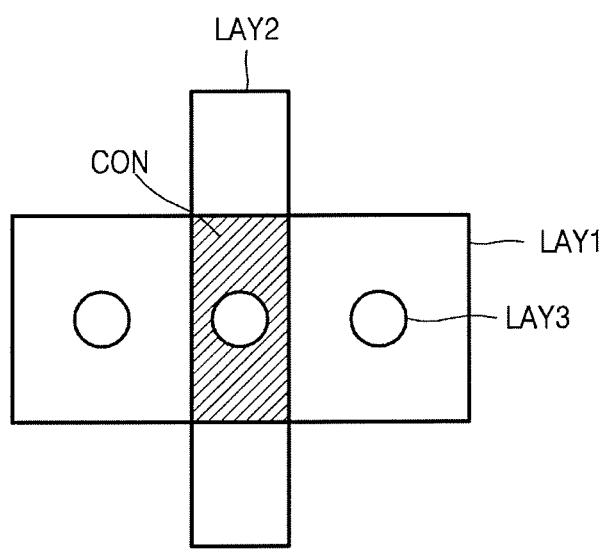

FIGS. 4 and 5 illustrate an example in which each layer is extracted from a rule file RUF, according to an example embodiment. Referring to FIGS. 2, 4, and 5, an example rule file RUF is a file associated with a check or design change for an area (a hatched area) where a contact is not formed among areas of a reference design file RDF where an active and a gate cross each other. As described above, the check or design change may be described as a limitation CON. In FIG. 4, the active is a layer 1 LAY 1, the gate is a layer 2 LAY2, and the contact is a layer 3 LAY3. In an example embodiment, the active may represent a source electrode or drain electrode of a transistor and the gate may represent a gate electrode for the transistor. The input layer (an input of FIG. 5) of the rule file RUF includes an active A, a gate B, and a contact C. Three unit operation layers may be performed to check the area where the contact is not formed among the areas where the active A and the gate B cross each other. Operation 1 (e.g., OPR1) is performed to find the areas where the active A and the gate B cross each other by performing a logical conjunction (e.g., a logical AND) by using the active A and the gate B on the reference design file RDF as sources (e.g., inputs). Operation 2 (e.g., OPR2) is performed to find an area where the contact C is not formed among gates B by performing a logical conjunction by using inverted values of the gate B and the contact C as sources. Operation 3 (e.g., OPR3) is performed to find an area where the contact C is not formed from among areas where the active A and the gate B cross each other by performing a logical conjunction by using operations 1 and 2 as sources. In operation 3, the limitation CON is output as an output layer. The output could indicate the limitation CON.

In FIGS. 4 and 5, the layer extraction unit 211 extracts an output CON by searching for program code indicating a rule check of the rule file RUF, extracts operation 3 derived from the output CON, and extracts operation 1 and operation 2 that are derived from operation 3. In this case, sources A, B, and C that are not derived from other operations from among sources A, B, C, OPR1, and OPR2 of the operations 1 to 3 may be extracted as inputs.

Figure 6:
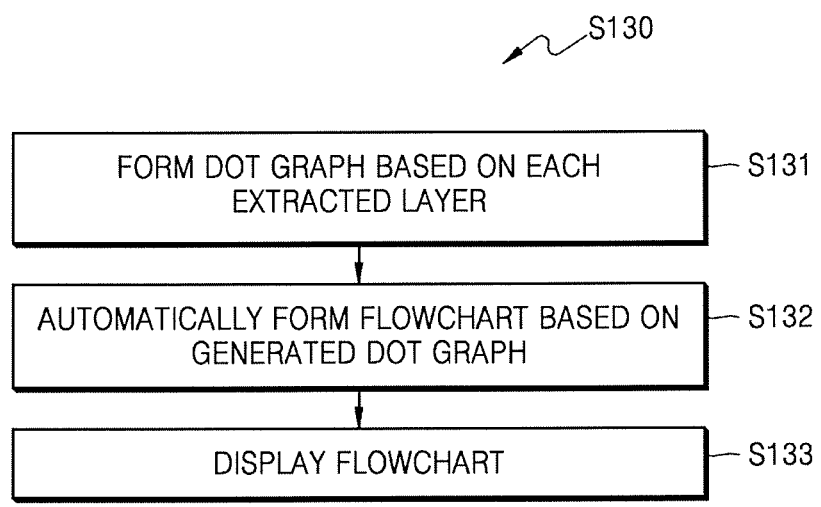
FIG. 6 is a flowchart of a method of forming a flowchart, according to an example embodiment of the inventive concept.

Referring back to FIG. 2, the flowchart forming unit 212 may form a flowchart based on relations between the extracted rule file RUF and respective layers. The flowchart may be formed by a method of FIG. 6. FIG. 6 illustrates an example of a method of forming a flowchart, according to an example embodiment of the inventive concept. Referring to FIGS. 2, 4, and 6, the flowchart forming unit 212 forms a dot graph based on each layer of the extracted rule file RUF, in operation S131. In an example embodiment, the dot graph is formed using a graph description language such as the DOT language. DOT is a plain text graph description language. DOT graphs may be saved in files with a .gv or a .dot extension. The DOT format can describe undirected or directed graphs. A dot graph may refer to the text stored within a DOT file to represent a particular flow chart. The text may include the name of the graph, and one or more strings identifying objects within the graph, their order in the graph, and relationships between those objects. For example, a string such as "a-b-c" could indicate that object 'b' is a child of object 'a', and object 'c' is a grandchild of object 'a', and a more specific string such as "a→b→c" could indicate a data flow from object 'a' to object 'b', and a data flow from object 'b' to object 'c'. The dot graph may use inputs of the rule file RUF as objects and have an orientation corresponding to a processing flow of inputs of the rule file RUF between the unit operations. For example, the rule file RUF may be a file showing an output Z that is generated after an OR operation is performed on X and Y of the reference design file RDF. In this case, X and Y are inputs, OR is a unit operation, and Z is an output. The dot graph may be generated to indicate a flow from the input X to the output Z and a flow from the input Y to the output Z.

Figure 7:
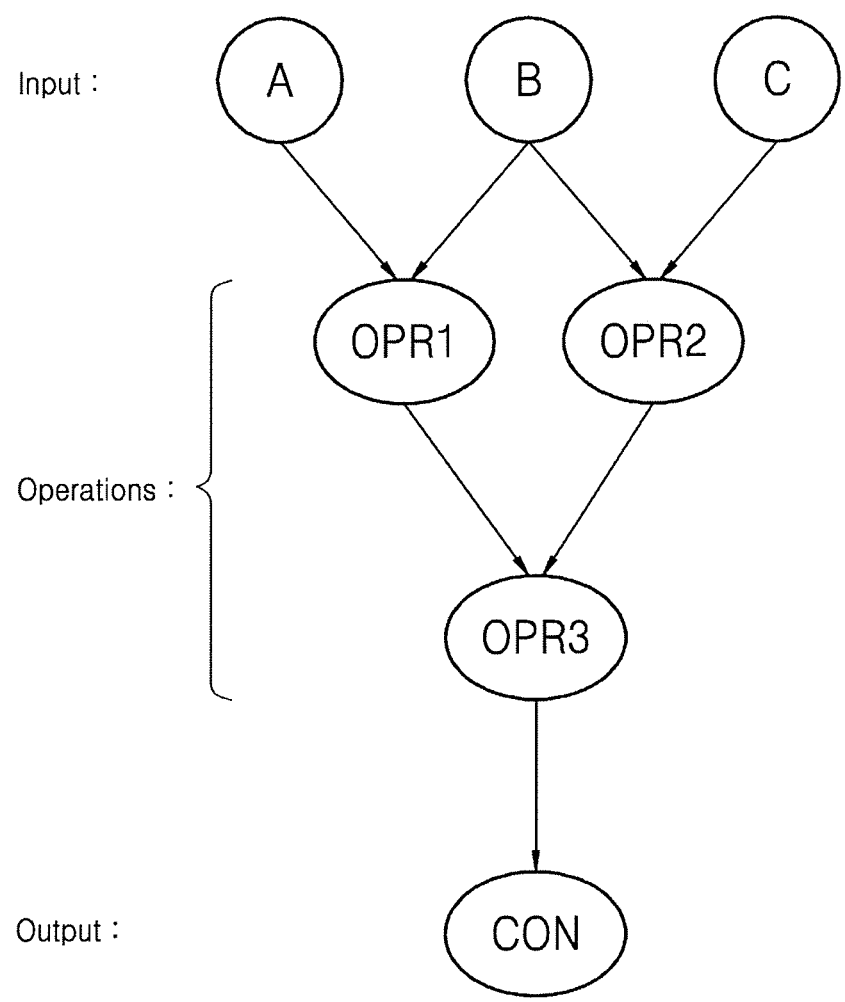
FIG. 7 illustrates an example of a flowchart according to an example embodiment of the inventive concept.

The flowchart forming unit 212 automatically forms the processing flow indicated by the dot graph as a flowchart of a graphic, in operation S132. For example, with regard to the example of FIG. 5, the flowchart may be formed as illustrated in FIG. 7. The input layer includes inputs (sources) A, B, and C, a flow line is connected from the inputs A and B to the process OPR1 indicating operation 1, and a flow line is connected from the inputs B and C to the process OPR2 indicating operation 2. Then, a flow line is connected from the processes OPR1 and OPR2 to a process OPR3 indicating operation 3. As a flow line is connected from the process OPR3 to a process CON indicating an output, the flowchart regarding the example of FIG. 5 may be formed.

Figure 8:
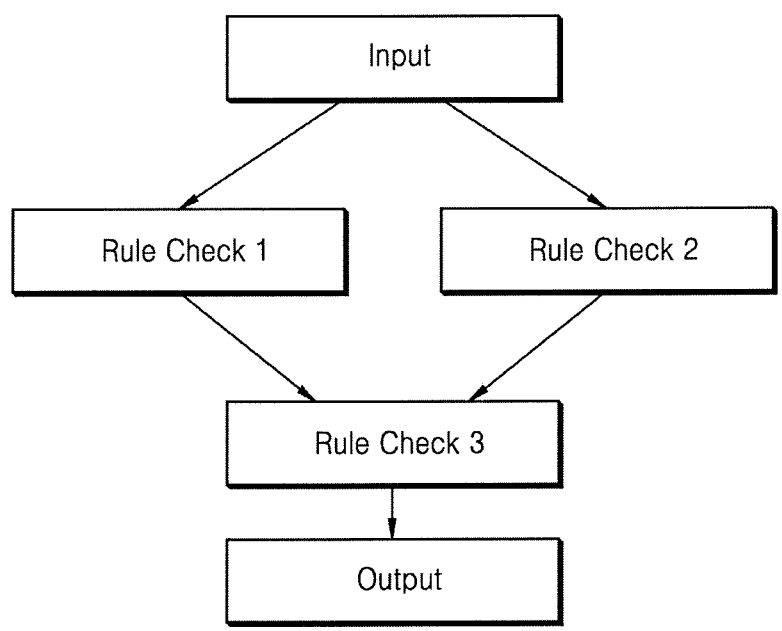
FIG. 8 is a block diagram of a rule file according to an example embodiment of the inventive concept.

The above-described flowchart includes one rule check, but the inventive concept is not limited thereto. For example, the rule file RUF according to one or more example embodiments may include two or more rule checks. Referring to FIG. 8 illustrating a rule file RUF according to an example embodiment, the rule file RUF may include three rule checks.

Figure 9:
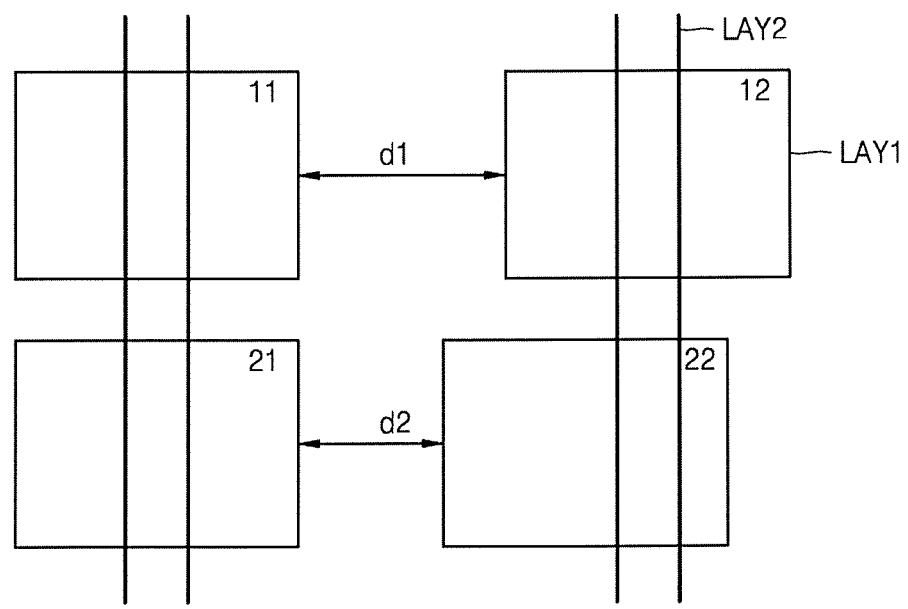
FIG. 9 illustrates a rule check according to an example embodiment of the inventive concept.

In the rule file RUF of FIG. 8, inputs become sources of a rule check 1 and a rule check 2, outputs of the rule check 1 and the rule check 2 become a source of a rule check 3. Thus, a final output of the rule file RUF may be generated. For example, the rule check 1 may be the same as the rule check of FIG. 5. That is, the rule check 1 may be the same as the rule check associated with the area where the contact is not formed from among the areas where the active and the gate cross each other. The rule check 2 may be, for example, the rule check associated with the active areas where the value of the distance between the active areas is less than or equal to the predetermined value. FIG. 9 illustrates an example in which a distance between active areas 11 and 12 among actives 11, 12, 13, and 14 that are the layer 1 is d1, but a distance between actives 21 and 22 is d2, which is less than d1. The rule check 2 may be used to check actives, a distance of which is less than d2.

The rule check 3 may be used to check the active areas where the value of the distance between the active areas is less than or equal to the predetermined value and the area where the contact is not formed from among the areas where the active and the gate cross each other. The rule file RUF, in which the result of processing the rule check 3 is reflected, may be generated. When the rule file RUF includes two or more rule checks, the flowchart to be formed may also include two or more rule checks.

In this case, the rule checks 1 to 3 may include all rules included in the rule file RUF. The flowchart is formed with regard to all of the rules. However, the inventive concept is not limited thereto. The rule file RUF may further include rule checks other than the rule checks 1 to 3. Also, the flowchart may be formed with regard to some of the rules of the rule file RUF after the unit operation layers with regard to the rule checks 1 to 3 are extracted. The flowchart may be displayed via a user interface to be described later (operation S133 of FIG. 6).

Referring back to FIG. 2, the rule file processing unit 210 further includes a debugging unit 213. In an example embodiment, the debugging unit 213 is a processor. The debugging unit 213 detects and corrects errors of the rule file RUF by analyzing the flowchart. For example, the debugging unit 213 may perform debugging by comparing a limitation CON on the reference design file that is input to generate the rule file RUF with the flowchart formed with regard to the rule file RUF. For example, the debugging unit 213 may analyze whether the rule file RUF is generated to have accurate inputs by comparing inputs of the rule file RUF with start data of the flowchart.

Figure 10:
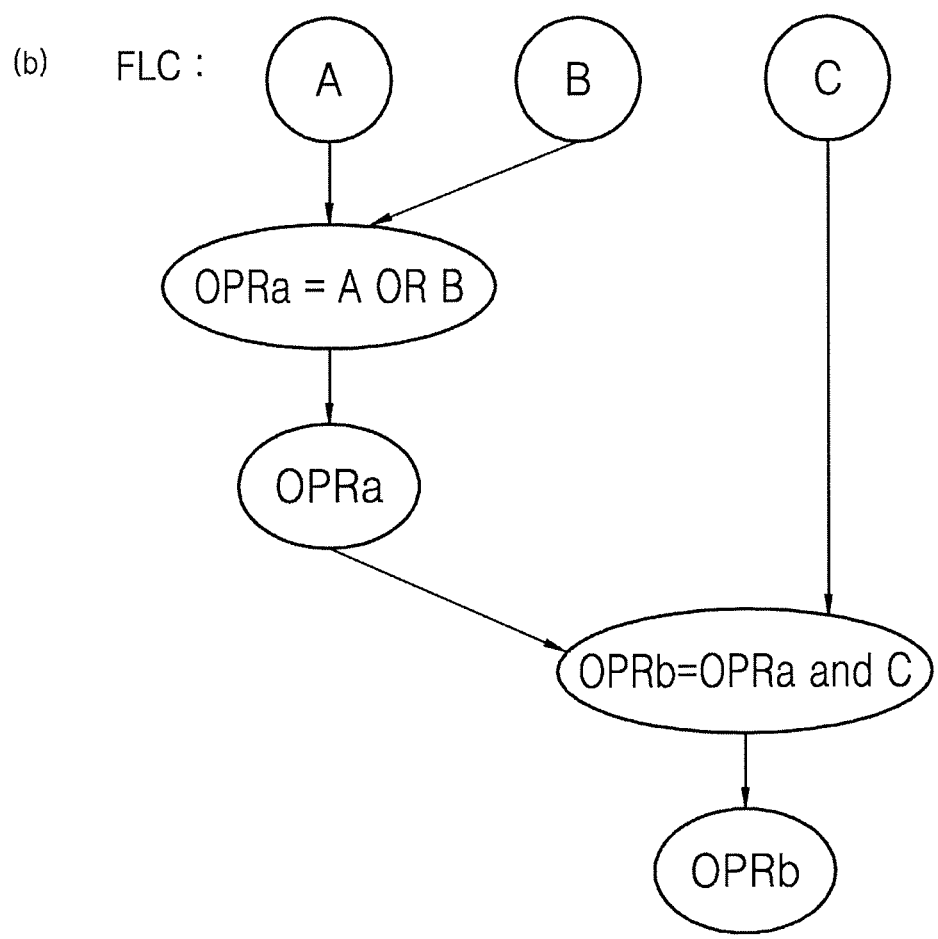
FIG. 10 is a diagram for explaining a debugging method according to an example embodiment of the inventive concept.

Referring to FIG. 10 illustrating a debugging operation, the limitation CON may be input to perform ((A OR B) OR ((A OR B) AND D)) on inputs A, B, and D. As described above, the limitation CON may be input as a specification, as illustrated in part (a) of FIG. 10. Referring to part (b) of FIG. 10, start data of the flowchart FLC formed through the above-described method is A, B, and C. The debugging unit 213 detects errors of the rule file by comparing the inputs in the specification with the start data of the flowchart FLC. The debugging unit 213 may report that the inputs have errors, as illustrated in part (c) of FIG. 10. In an example embodiment, the limitation on the reference design file specifies one or more first inputs, root nodes in the flow chart generated from the rule file RUF represents one or more second inputs, and the rule file is correct when the first and second inputs match, and the rule file is incorrect when the first and second inputs do not match. For example, part (a) of FIG. 10 shows first inputs of A, B, and D in a limitation of the reference design file, part (b) of FIG. 10 shows second inputs A, B, and C among the root nodes in a flow chart generated from a rule file RUF, and because A, B, and D does not match A, B, and C, it can be concluded that the rule file RUF has an error.

The debugging unit 213 receives feedback regarding the flowchart FLC via a user interface and may debug the errors of the rule file RUF based on the received feedback regarding the flowchart FLC.

Figure 11:
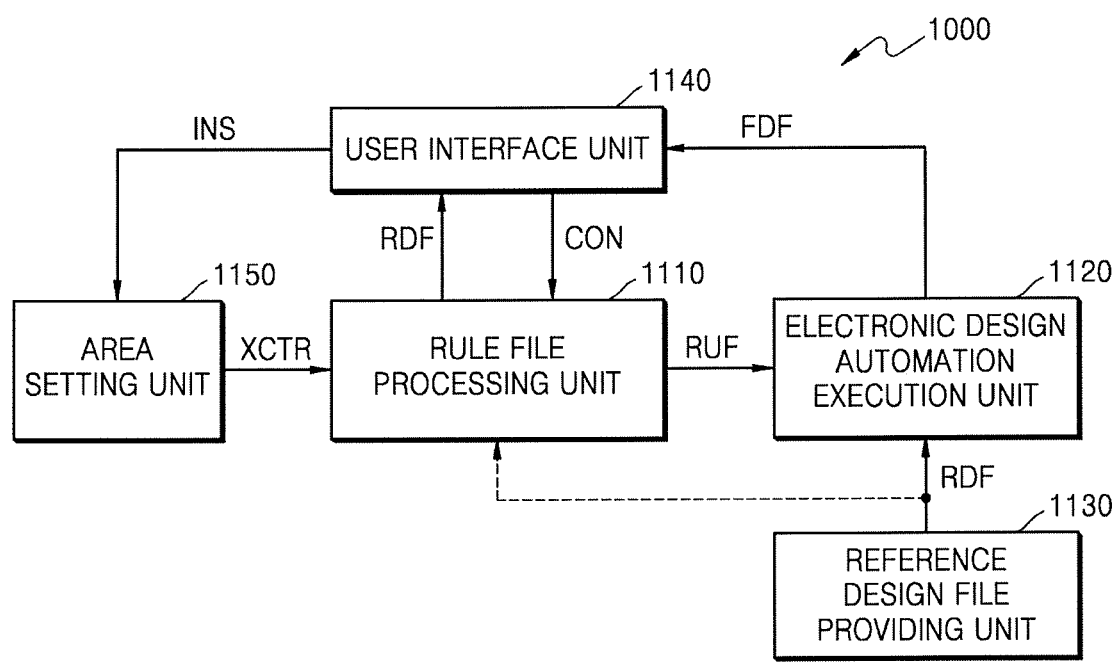
FIG. 11 is a block diagram of an automatic design automation apparatus according to an example embodiment of the inventive concept.

FIG. 11 is a block diagram of an automatic design automation apparatus 1000 according to an example embodiment of the inventive concept. Referring to FIG. 11, the electronic design automation apparatus 1000 includes a rule file processing unit 1110 and an electronic design automation execution unit 1120, like the electronic design automation apparatus 200 of FIG. 1. The rule file processing unit 1110 and the electronic design automation execution unit 1120 of FIG. 11 may perform the same operations as the rule file processing unit 210 and the electronic design automation execution unit 220 of FIG. 2. The electronic design automation apparatus 1000 of FIG. 11 may further include a reference design file providing unit 1130, a user interface unit 1140, and an area setting unit 1150.

The reference design file providing unit 1130 stores the above-described reference design file RDF and may provide the reference design file RDF to the rule file processing unit 1110 or the electronic design automation execution unit 1120 according to a request. As described above, the reference design file RDF may have a GDS format, or the like.

The user interface unit 1140 may provide a user with information on the rule file RUF output from the rule file processing unit 1110 or a final design file FDF generated by the electronic design automation execution unit 1120. The information on the rule file RUF output from the rule file processing unit 1110 may be the flowchart associated with the rule file RUF, program code, etc.

The user interface unit 1140 may include a display. The user interface unit 1140 supports wired/wireless communication and may output the flowchart or the final design file FDF to an outside source. In an example embodiment, the user interface unit 1140 includes a processor, a transceiver to support the wireless communication, memory, and the display. Also, the above-described limitation CON may be provided to the rule file processing unit 1110 as a specification via the user interface unit 1140. The user interface unit 1140 may receive feedback signals INS regarding the flowchart from the user.

Figure 12:
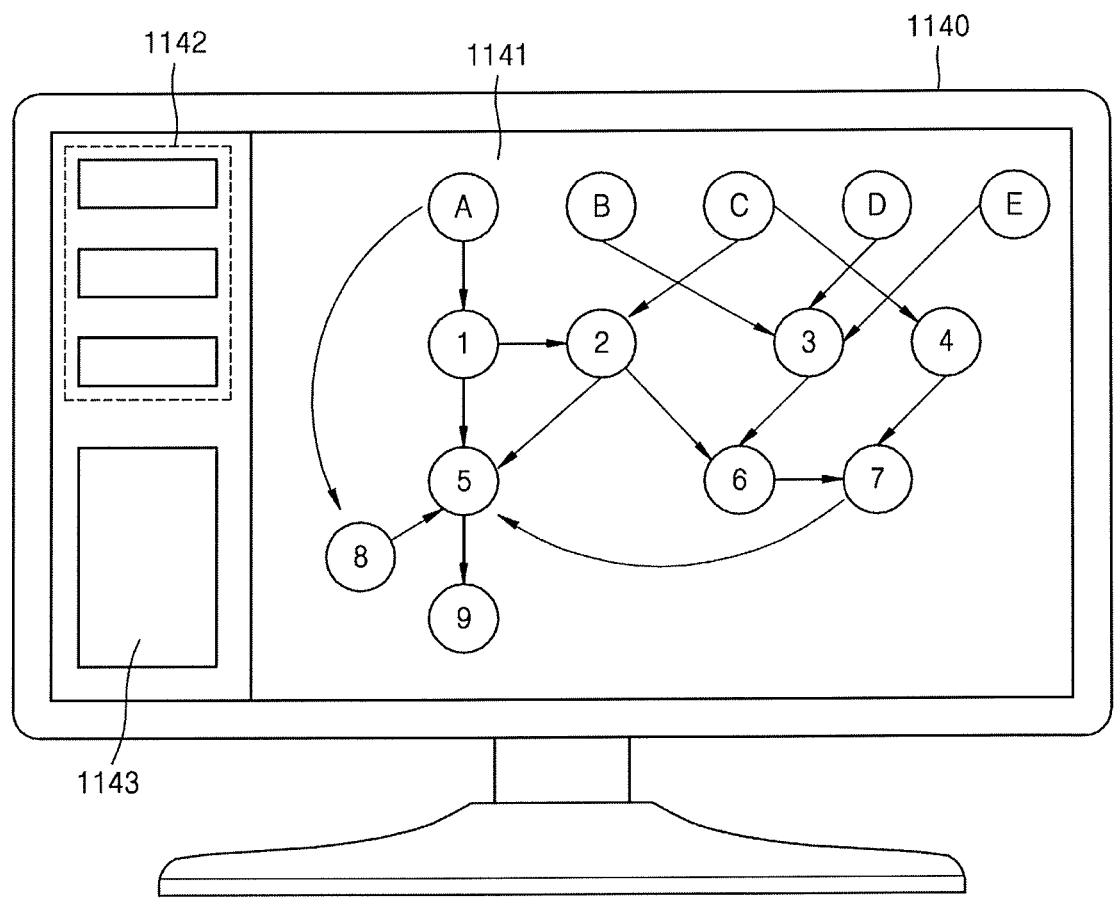
FIG. 12 illustrates an example of a screen displayed by a reference automatic design automation apparatus of FIG. 11.

The area setting unit 1150 generates control signals XCTR based on the feedback signals INS. In an example embodiment, the area setting unit 1150 includes a signal generator circuit capable of generating the feedback signals INS. In an example embodiment, the feedback signals INS indicate (e.g., identify) one or more parts of the flowchart. Each part of the flowchart may correspond to a different rule check (for example, the rule checks 1 to 3 of FIG. 8). The rule file processing unit 1110 may provide the user with the program code regarding a part designated in the flowchart via the user interface unit 1140, in response to the control signals XCTR. FIG. 12 illustrates an example of a screen displayed by the automatic design automation apparatus 1000 of FIG. 11. Referring to FIGS. 11 and 12, the user interface unit 1140 displays a first display area 1141 on which flowcharts are displayed, a second display area 1142 on which each part of the flowchart is provided as a button, and a third display area 1143 on which program code associated with a designated part among all parts of the flowchart is provided.

As described above, the flowchart may include a plurality of rule checks, and as the user arbitrarily touches or clicks a rule check among the rule checks included in the flowcharts displayed on the first display area 1141, the touched or clicked rule check may be designated. The user may arbitrarily designate a rule check by touching or clicking one of the buttons displayed on the second display area 1142. With regard to the example of FIG. 8, the second display area 1142 may display buttons 1, 2, and 3 such that the rule checks 1, 2, and 3 are displayed on the first display area 1141. For example, when the user clicks the button 1, a part of the flowchart which corresponds to the rule check 1 is displayed or the rule check 1 is displayed on the first display area 1141. In response to the clicking of the button 1, program code regarding the rule check 1 is displayed on the third display area 1143.

According to the electronic design automation apparatus and method, when writing rules designed by using an electronic design automation tool are verified, code errors or the like may be easily checked by using a systematic flowchart that is automatically formed, and thus, an integrated circuit may be accurately designed. In this case, the formed flowchart is automatically compared with matters input by the user and then the rule file RUF is automatically debugged, which may increase the design accuracy of the integrated circuit. Accordingly, a defect rate during manufacturing of products may decrease. Also, according to the electronic design automation apparatus and method, when writing rules designed by using an electronic design automation tool are verified, a time taken to design an integrated circuit by using a systematic flowchart that is automatically formed may decrease, and the integrated circuit may be easily, accurately, and quickly designed, thereby decreasing manufacturing costs.

Figure 13:
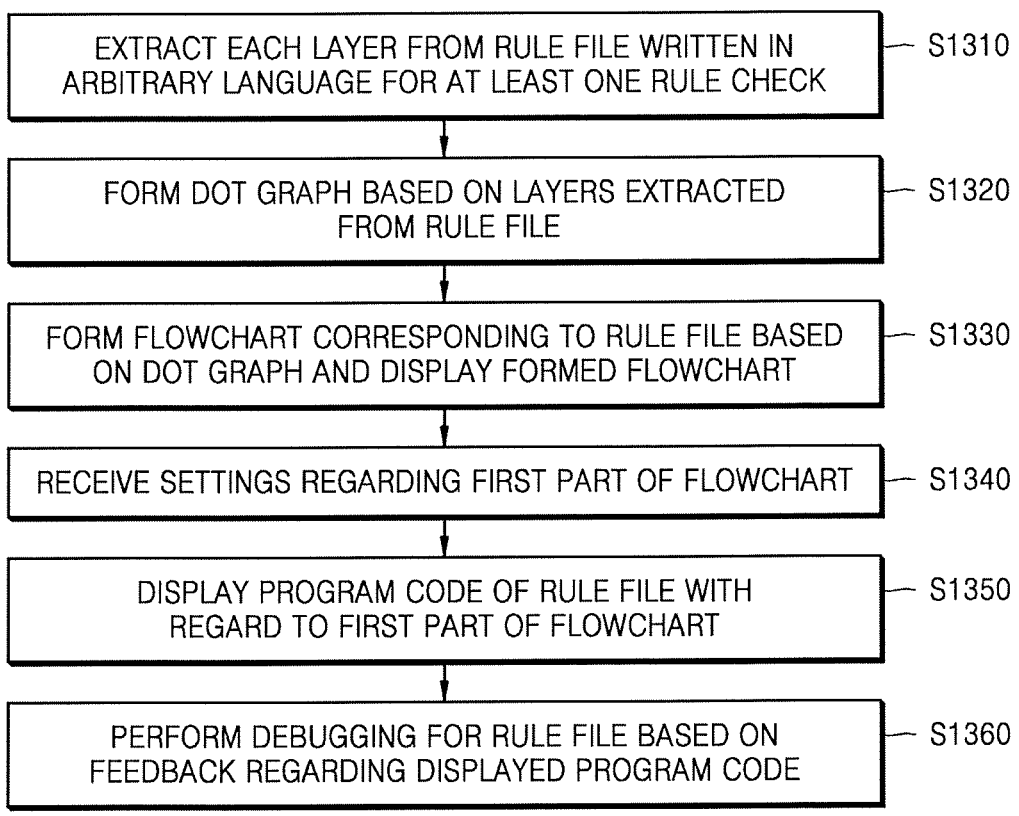
FIGS. 13 and 14 are flowcharts of electronic design automation methods according to an example embodiment of the inventive concept.

FIG. 13 is a flowchart of an electronic design automation method according to an example embodiment of the inventive concept. Referring to FIG. 13, the electronic design automation method includes: extracting each layer from a rule file written in an arbitrary language for a rule check (S1310); forming a dot graph based on the layers extracted from the rule file (S1320); forming a flowchart corresponding to the rule file based on the dot graph and displaying the formed flowchart (S1330); receiving settings regarding a first part of the flowchart (S1340); displaying program code of the rule file with regard to the first part of the flowchart (S1350); and performing debugging for the rule file based on feedback regarding the displayed program code (S1360).

Figure 14:
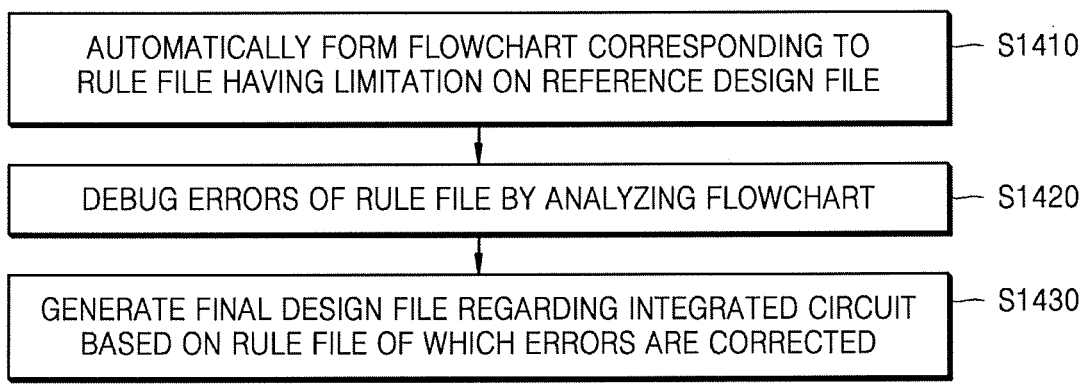

FIG. 14 is a flowchart of an electronic design automation method according to an example embodiment of the inventive concept. Referring to FIG. 14, the electronic design automation method includes: automatically forming a flowchart corresponding to a rule file having a limitation on a reference design file (S1410); debugging errors of the rule file by analyzing the flowchart (S1420); and generating a final design file regarding an integrated circuit based on the rule file of which the errors are corrected (S1430).

Each operation of the electronic design automation methods of FIGS. 13 and 14 has been described in detail through the descriptions of the electronic design automation method or the electronic design automation apparatus above, and thus, detailed descriptions thereof will be omitted. The electronic design automation method that has been described so far is a method used to perform an electronic automation design by a computer and may be stored in a computer-readable recording medium having recorded thereon commands executable by the computer for performing the above-described method.

Figure 15:
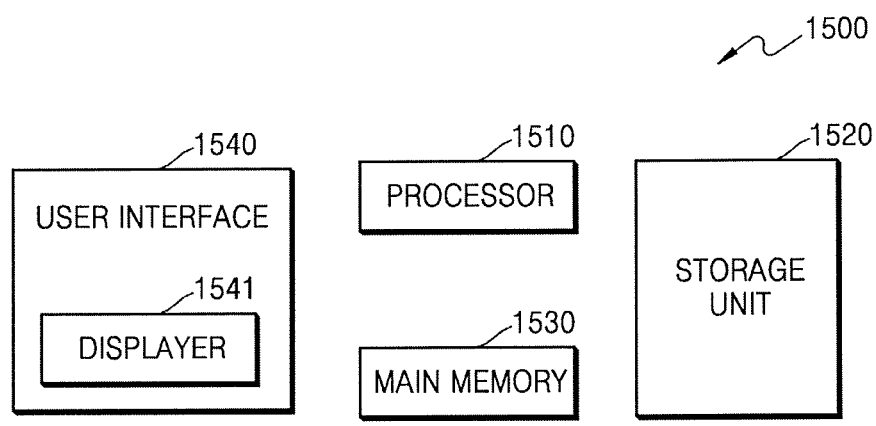
FIGS. 15 and 16 are block diagrams of an electronic design automation apparatus according to an example embodiment of the inventive concept.

FIG. 15 is a block diagram of an electronic design automation apparatus 1500 according to an example embodiment of the inventive concept. Referring to FIG. 15, the electronic design automation apparatus 1500 includes a processor 1510, a storage unit 1520, a main memory 1530, and a user interface 1540. The processor 1510 performs or controls operations of extracting layers from the above-described rule file, forming a flowchart, debugging, etc. For example, the processor 1510 includes the rule file processing unit 210 and the electronic design automation execution unit 220 of FIG. 2 and may perform the electronic design automation method. Alternatively, the processor 1510 may control operations performed by the rule file processing unit 210 and the electronic design automation execution unit 220 of FIG. 2. An electronic design automation tool may be stored in the storage unit 1520. The electronic design automation tool may include the rule file processing unit 210 and the electronic design automation execution unit 220 of FIG. 2. Also, files necessary to execute the electronic design automation tool or execution results may be stored in the storage unit 1520, and thus, a rule file, a reference design file, a flowchart, or the like may be stored in the storage unit 1520. The main memory 1530 may be dynamic random access memory (DRAM), static RAM (SRAM), etc. and may be configured to load the electronic design automation tool, the rule file, the reference design file, or the like, which is stored in the storage unit 1520 in order to execute the electronic design automation tool. As described above, the user interface 1540 may receive a specification or feedback of the user or may provide the user with the flowchart, the final design file, etc. The user interface 1540 may include a displayer 1541 for displaying the flowchart that is automatically formed with regard to the rule file. In an embodiment, the displayer 1541 is a displayed graphical window.

Figure 16:
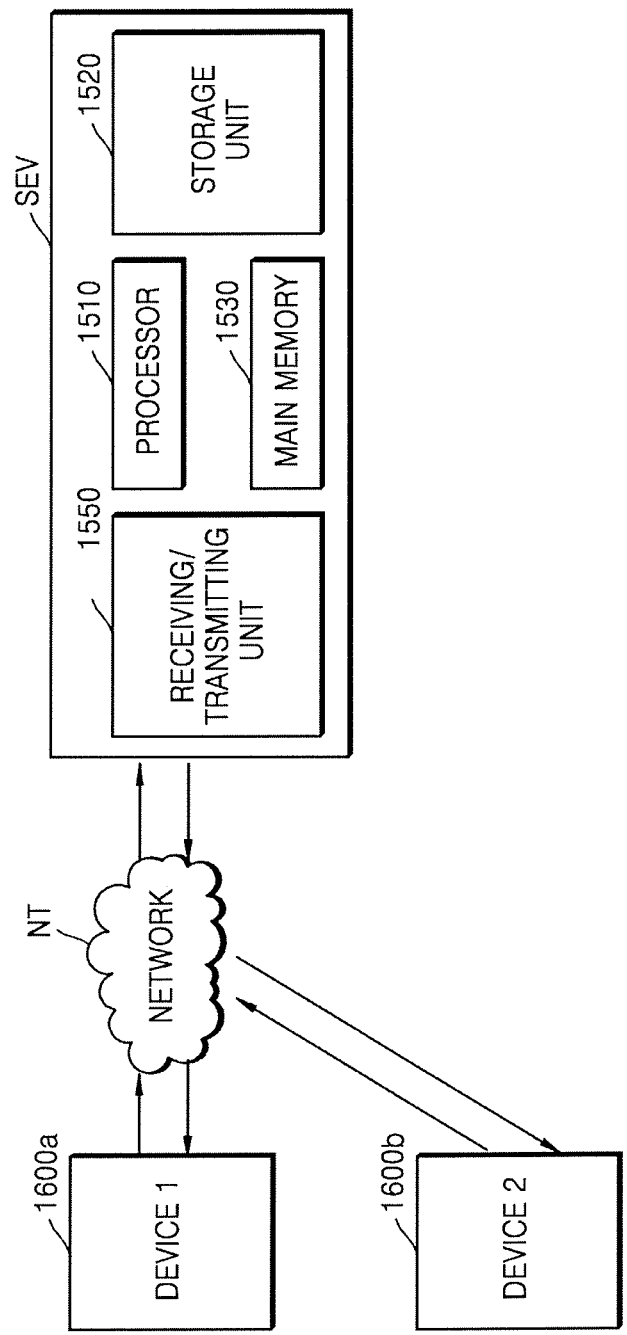

FIG. 16 is a block diagram of an electronic design automation apparatus SEV according to an example embodiment of the inventive concept. Referring to FIG. 16, the electronic design automation apparatus SEV includes the processor 1510, the storage unit 1520, and the main memory 1530, like the electronic design automation apparatus 1500. The electronic design automation apparatus SEV includes a receiving/transmitting unit 1550 instead of the user interface 1540. The receiving/transmitting unit 1550 may receive a specification or feedback of the user from a plurality of devices 1600a and 1600b connected to a network NT or may provide the user with the flowchart, the final design file, or the like. In an example embodiment, the receiving/transmitting unit 1550 is a network interface card or a transceiver.

Figure 17:
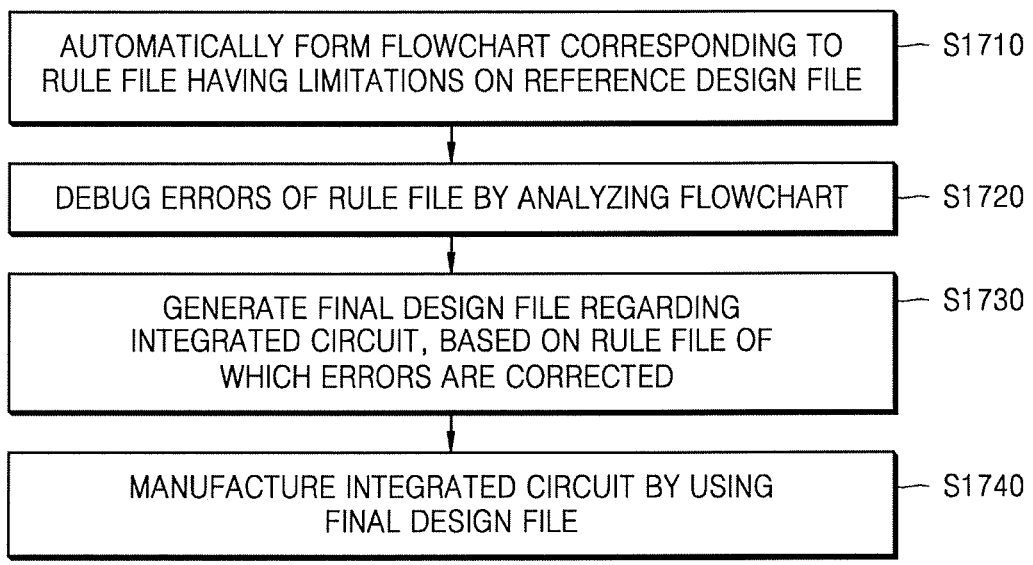
FIG. 17 is a flowchart of a method of manufacturing an integrated circuit, according to an example embodiment of the inventive concept.

FIG. 17 is a flowchart of a method of manufacturing an integrated circuit, according to an example embodiment of the inventive concept. Referring to FIG. 17, the method includes: automatically forming a flowchart corresponding to a rule file having limitations on a reference design file (S1710); debugging errors of the rule file by analyzing the flowchart (S1720); generating a final design file regarding an integrated circuit, based on the rule file of which the errors are corrected (S1730); and manufacturing the integrated circuit by using the final design file (S1740). As described above, the final design file may be generated by using the flowchart formed in correspondence to the rule file and performing debugging on the rule file. The integrated circuit may be manufactured by using the final design file.

Figure 18:
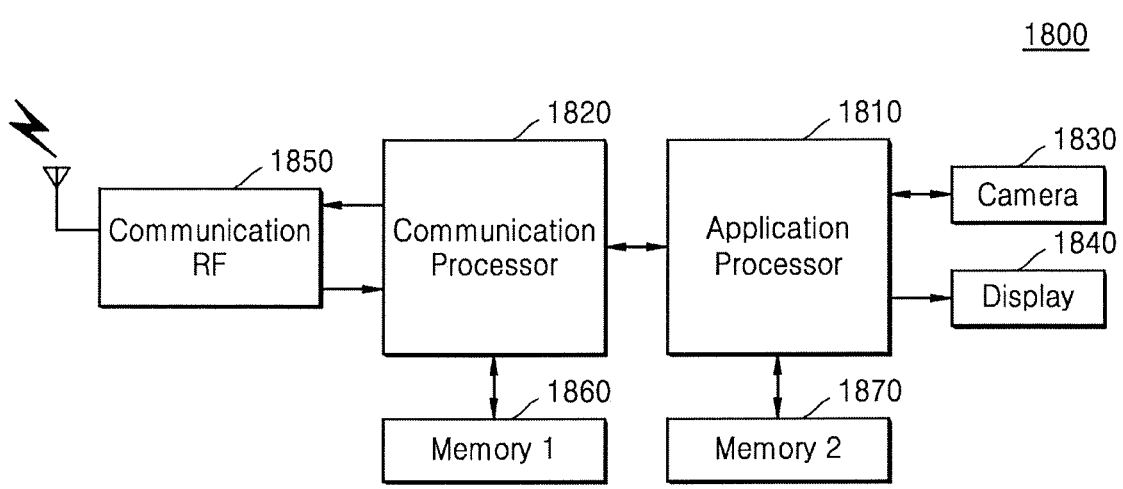
FIG. 18 is a block diagram of a mobile device manufactured through a method of manufacturing an integrated circuit, according to an example embodiment of the inventive concept.

FIG. 18 is a block diagram of a mobile device 1800 manufactured through a method of manufacturing an integrated circuit, according to an example embodiment of the inventive concept. Referring to FIG. 18, the mobile device 1800 includes an application processor 1810, a communication processor 1820, a camera 1830, a display 1840, a communication modem 1850, and memories 1860 and 1870. For example, the communication modem 1850 may communicate using radio frequencies (RF). Applications may be executed by the application processor 1810 in the mobile device 1800. For example, when an image is captured by the camera 1830, the application processor 1810 stores the captured image in the memory 1870 and may display the stored image on the display 1840. The application processor 1810 may be an integrated circuit or a system-on-chip manufactured through the method of manufacturing an integrated circuit of FIG. 17. The captured image may be transmitted to an external device (not shown) via the communication modem 1850 in accordance with control of the communication processor 1820. In this case, the communication processor 1820 may temporarily store the image in the memory 1860 in order to transmit the image to the outside. The communication processor 1820 may control communication for phone calls, data reception/transmission, etc.

While the inventive concept has been particularly shown and described with reference to example embodiments thereof, it will be understood that various changes in form and details may be made therein without departing from the spirit and scope of the inventive concept.

What is claimed is:

1. An electronic design automation method comprising:
   loading, by a processor, a rule file having limitations on a reference design file;
   extracting, by the processor, a plurality of unit operations for respectively performing the limitations from the loaded rule file;
   automatically forming, by the processor, a flowchart corresponding to the rule file based on relations between the plurality of unit operations;
   correcting the loaded rule file using the flowchart and the reference design file;
   verifying a layout of an integrated circuit represented by the reference design file using the corrected rule file; and
   manufacturing the integrated circuit using the reference design file upon the verifying indicating the layout is correct.

2. The electronic design automation method of claim 1, wherein the extracting comprises:
   extracting an output of the rule file; and
   sequentially extracting the plurality of unit operations derived from the output of the rule file.

3. The electronic design automation method of claim 1, further comprising extracting a source, which is not derived from another unit operation from among sources of the plurality of unit operations, as an input of the rule file.

4. The electronic design automation method of claim 1, wherein the extracting of the plurality of unit operations comprises extracting a plurality of unit operations regarding all rules included in the rule file, and the automatically forming of the flowchart comprises forming the flowchart indicating an entire part of the rule file.

5. The electronic design automation method of claim 1, wherein the extracting of the plurality of unit operations comprises extracting a plurality of unit operations regarding some rules included in the rule file, and the automatically forming of the flowchart comprises forming the flowchart indicating some parts of the rule file.

6. The electronic design automation method of claim 1, wherein the automatically forming of the flowchart comprises automatically forming the flowchart based on a dot graph having an orientation corresponding to a processing flow of inputs of the rule file between the plurality of unit operations, wherein the dot graph uses the inputs of the rule file as objects.

7. The electronic design automation method of claim 1, further comprising:
   comparing the flowchart with the limitations on the reference design file, which are input via a user interface; and
   extracting errors of the rule file according to a result of the comparing.

8. The electronic design automation method of claim 7, wherein the comparing comprises determining whether a source included in the limitations on the reference design file is consistent with start data of the flowchart.

9. The electronic design automation method of claim 7, further comprising debugging the errors of the rule file.

10. The electronic design automation method of claim 1, further comprising:
    displaying the flowchart via a user interface; and setting a part of the flowchart via the user interface; and
displaying program code of the rule file corresponding to the set part of the flowchart.

11. The electronic design automation method of claim 1, further comprising:
extracting errors of the rule file by analyzing the flowchart;
correcting the extracted errors to generate a corrected rule file; and
generating a final design file representing an integrated circuit based on the corrected rule file.

12. The electronic design automation method of claim 1, further comprising generating the rule file by using a standard verification rule format (SVRF) language or a Tcl verification format (TVF) language, in accordance with the limitations on the reference design file.

13. An electronic design automation method comprising:
automatically forming, by a processor, a flowchart from a rule file having limitations on a reference design file;
debugging errors of the rule file by the processor comparing the flowchart with the reference design file to generate a corrected rule file;
generating, by the processor, a final design file representing an integrated circuit based on the corrected rule file; and
manufacturing the integrated circuit by using the final design file.

14. An electronic design automation method comprising:
generating, by a processor, a flow chart from rule checks in the rule file;
determining, by a processor, first inputs from the flow chart;
correcting, by a processor, the rule file based on a result of comparing the first inputs with second inputs in a limitation of a reference design file;
verifying a layout of an integrated circuit represented by the reference design file using the corrected rule file; and
manufacturing the integrated circuit using the reference design file upon the verifying indicating the layout is correct.

15. The method of claim 14, wherein the rule file is corrected when the comparing indicates the first inputs do not match all the second inputs.

16. The method of claim 14, wherein the first inputs are root nodes in the flow chart.

17. The method of claim 14, further comprising generating, by a processor, a dot graph from the rule file, wherein the flow chart is generated from the dot graph.

18. The method of claim 14, where the rule file and the limitation are in one of a standard verification rule format (SVRF) or a TcL verification format (TVF).

* * * * *